March 3, 1959 R. C. SANDERS, JR 2,876,391

ELECTRICAL CIRCUIT ASSEMBLY

Filed Dec. 9, 1953 4 Sheets-Sheet 1

Fig. I

ROYDEN C. SANDERS Jr
*INVENTOR.*

BY [signature]

ATTORNEY

March 3, 1959 R. C. SANDERS, JR 2,876,391

ELECTRICAL CIRCUIT ASSEMBLY

Filed Dec. 9, 1953 4 Sheets-Sheet 2

Royden C. Sanders, Jr.
*INVENTOR.*

*BY* [signature]
ATTORNEY

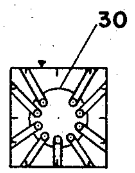
FIG. 3
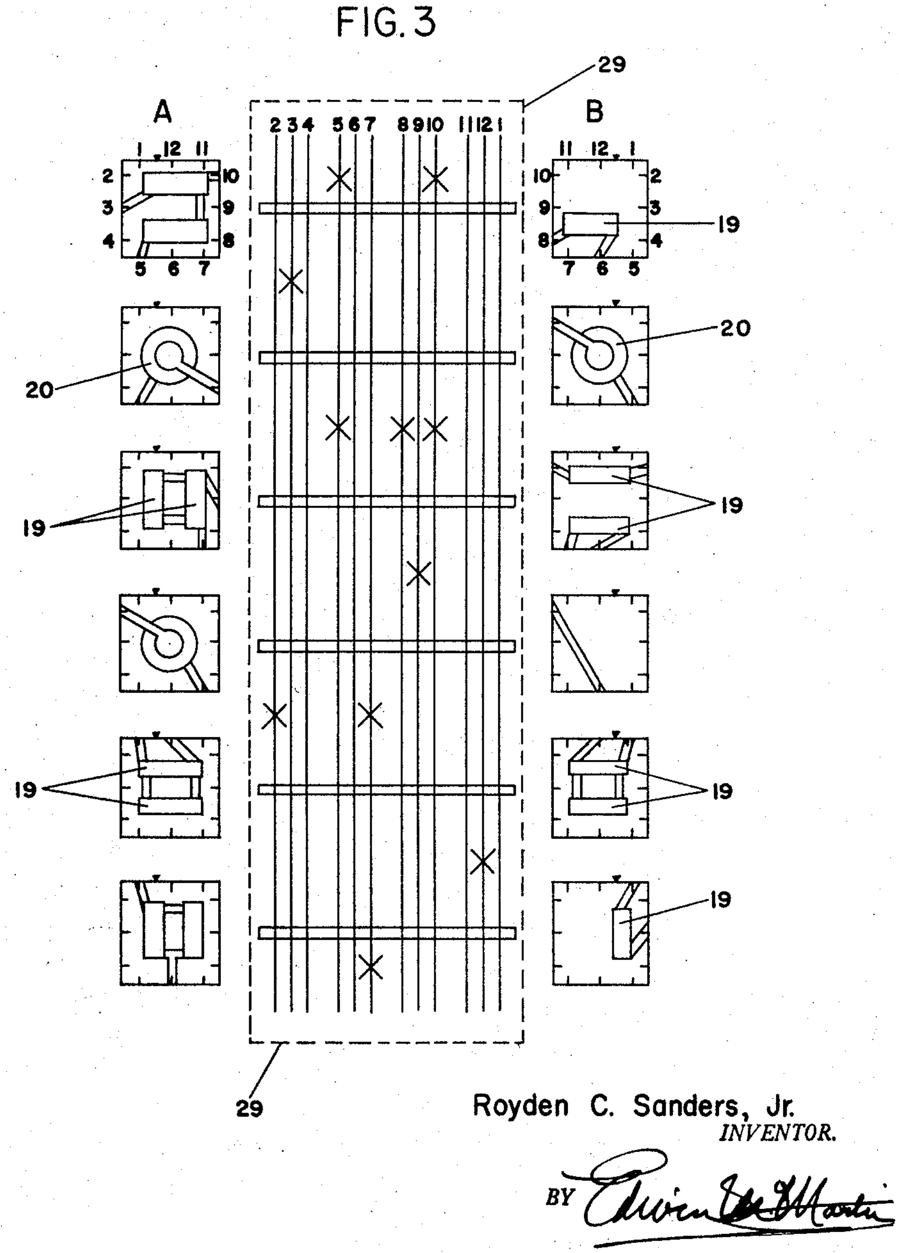
Royden C. Sanders, Jr.
*INVENTOR.*
*BY* [signature]
ATTORNEY March 3, 1959 R. C. SANDERS, JR 2,876,391

ELECTRICAL CIRCUIT ASSEMBLY

Filed Dec. 9, 1953 4 Sheets-Sheet 4

Royden C. Sanders, Jr. *INVENTOR.*

*BY* [signature]

ATTORNEY

United States Patent Office 2,876,391

Patented Mar. 3, 1959

2,876,391

ELECTRICAL CIRCUIT ASSEMBLY

Royden C. Sanders, Jr., Nashua, N. H., assignor, by mesne assignments, to Sanders Associates, Inc., Nashua, N. H., a corporation of Delaware Application December 9, 1953, Serial No. 397,231

2 Claims. (Cl. 317—101)

Figure 1:
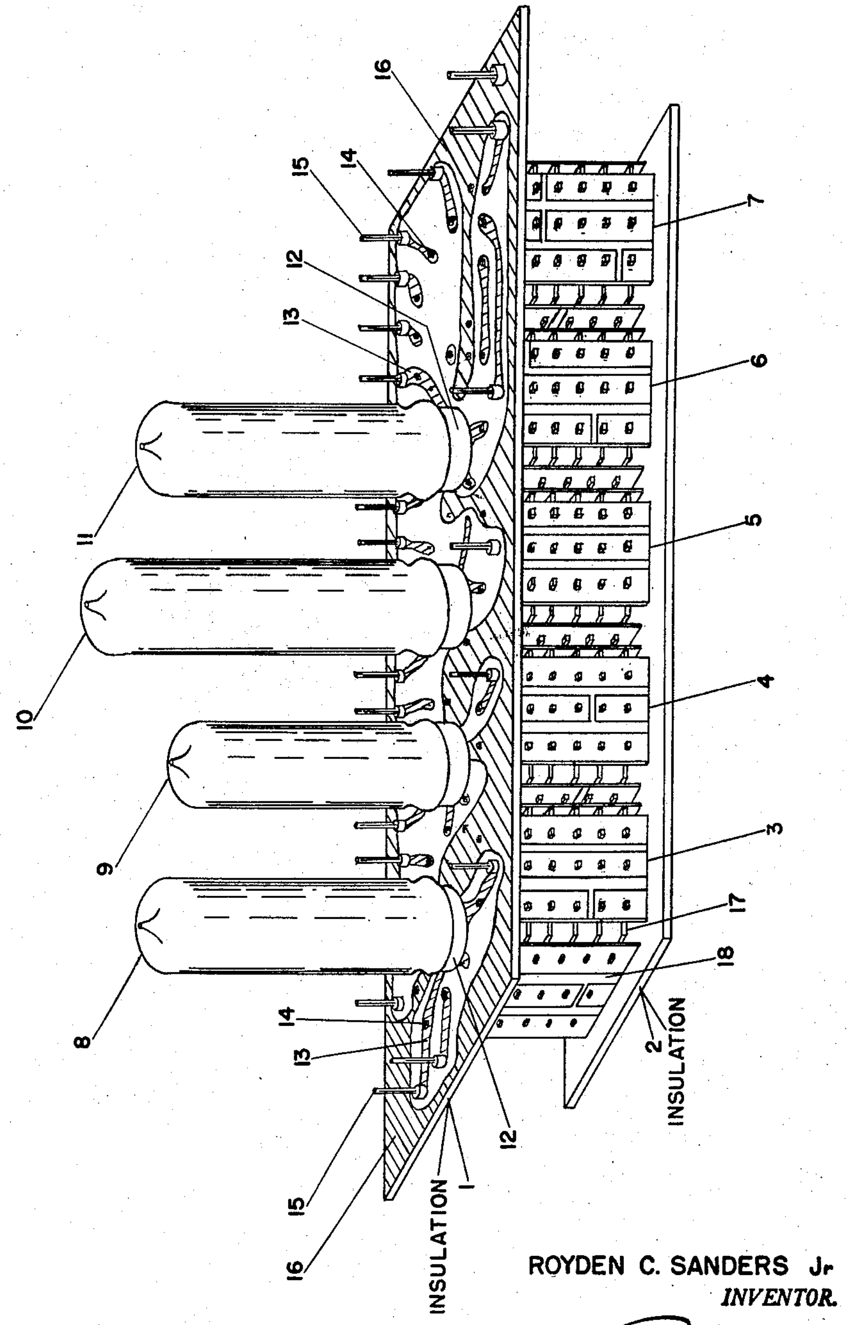

This invention relates to electronic apparatus, its elements and components and to methods for the manufacture and assembly thereof.

The invention particularly relates to electrical circuit assemblies employing modules having plastic-like wafer and riser elements and base plates and to mechanized production systems for such assemblies.

The novel structures and manufacturing techniques of the present invention permit the simultaneous manufacture of large quantities of electronic apparatus. High speed and automatic production techniques are made possible as well as the provision of economical, compact and especially reliable apparatus.

An object of the present invention is to provide an improved electrical circuit assembly.

Another object of the invention is to provide an improved method of manufacturing electronic component assembly units.

A further object of the invention is to provide an improved matrix for the simultaneous fabrication of functionally related module wafer and other elements of a complete circuit assembly.

A further object is to provide an improved electronic component assembly unit utilizing the techniques aforedescribed.

Other and further objects of the invention will be apparent from the following detailed description of a typical embodiment thereof, taken in connection with the accompanying drawings.

In accordance with the present invention there is provided an electrical circuit assembly comprising a first printed circuit panel base plate having apertures therein and conductors extending from selected ones of the apertures. A second printed circuit panel base plate is congruently disposed in parallel spaced relation with the first base plate. The second base plate has apertures therein and tube sockets affixed thereto. The second base plate also has conductors extending from selected ones of the apertures and the tube sockets. A plurality of composite electronic component modules, each having a plurality of wafer elements, is congruently arranged in parallel spaced relation. A plurality of wedge-shaped projecting members having conductive surfaces extends from each edge of the wafer elements. Electric circuit elements are mounted on the wafer elements. There is also provided a plurality of supporting riser panels, one for each side of the wafer elements. The supporting riser panels have projecting riser tabs on the two longitudinally opposed edges thereof. The riser tabs have conductors thereon and are so spaced as to register with and engage the apertures in the base plates. This provides selective circuit connections interconnecting the modules and the base plates. The supporting riser panels have oblong apertures therein into which the projecting members of the wafer elements are forcibly inserted. A plurality of conductive paths extend from the riser panels electrically and selectively to interconnect the circuit elements.

The invention will be more fully understood by reference to the preferred embodiments thereof described in the accompanying drawings.

Figure 2:
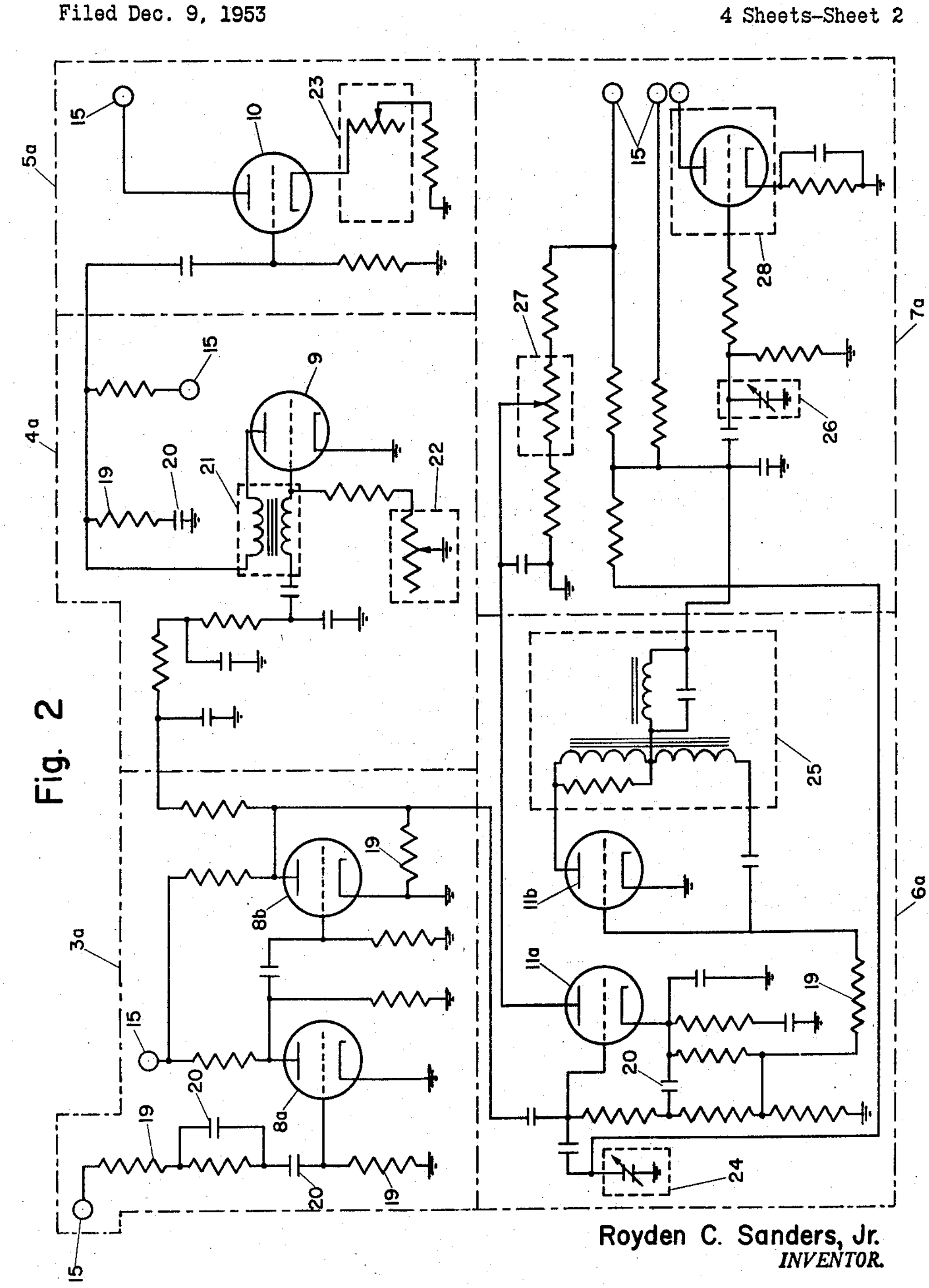
Figure 4:
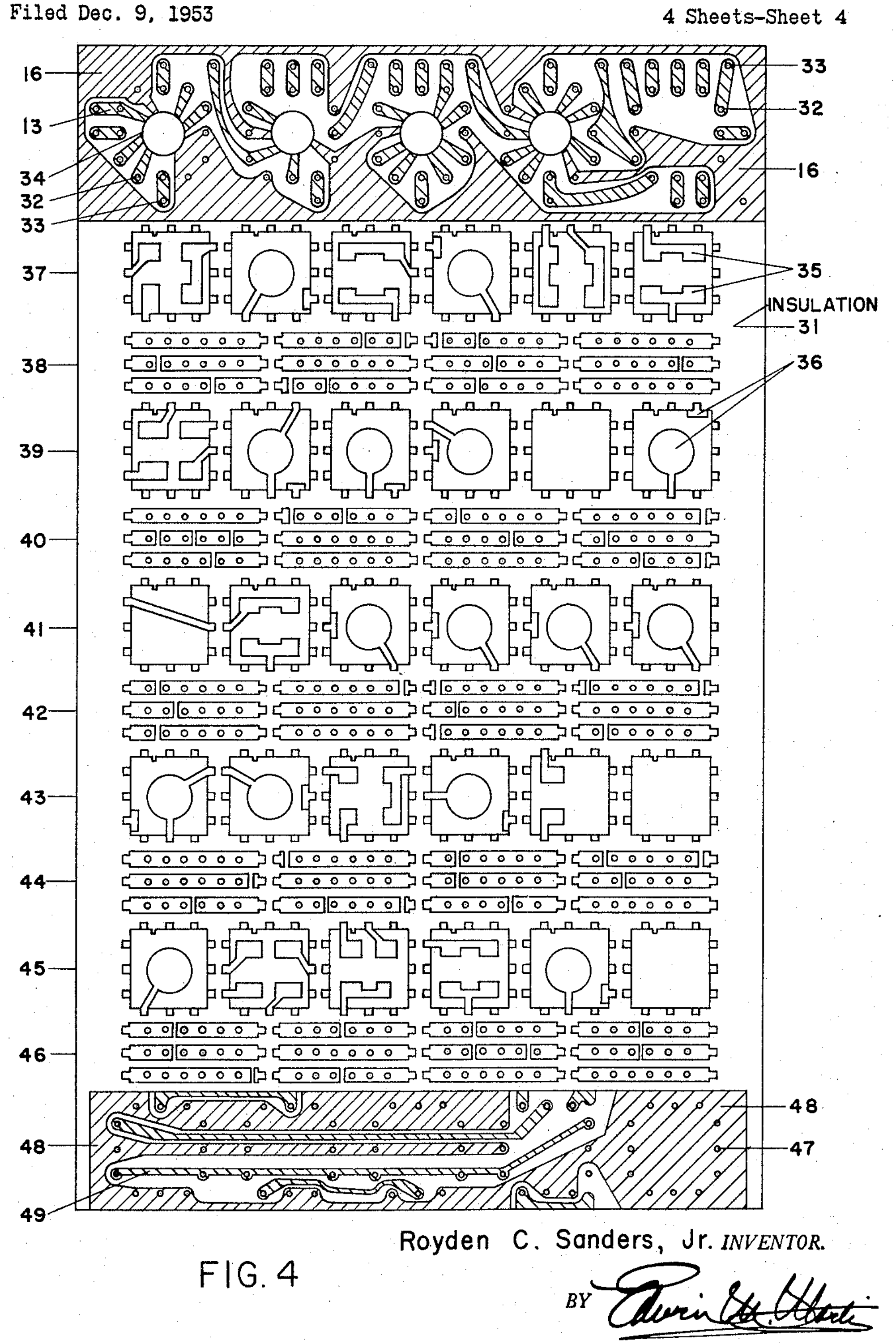

In the accompanying drawings, Fig. 1 is a three-dimensional view of an electrical circuit assembly unit embodying the present invention and made in accordance with the improved manufacturing method thereof; Fig. 2 is a circuit diagram of the unit shown in Fig. 1; Fig. 3 is a connection diagram showing the wafer and riser elements and indicating their connections, for one of the modules of Fig. 1; and Fig. 4 is a plan view of the matrix of the present invention used for the wafer and riser elements and mounting plates of the complete unit shown in Fig. 1.

Referring now in more detail to the drawings, the electrical circuit assembly unit illustrated in Fig. 1 is a typical modularized system embodying this invention and manufactured in accordance with its method. This unit includes vertical and horizontal deflection circuits for a television receiver. The deflection voltages are employed in the conventional manner to effect the scanning of the cathode ray tube of a television receiver tube. A circuit diagram of the deflection system is shown in Fig. 2. For convenience in description, certain sections of this system are defined by broken lines.

More particularly, the system of Fig. 1 includes first and second printed circuit panels 1 and 2 between which are secured five electronic component modules 3, 4, 5, 6 and 7, and vacuum tubes 8, 9, 10 and 11 are secured to tube sockets 12 carried by the upper base plate 1, as shown. The modules comprise wafer elements 17 carrying electrical components and supported by side member or riser panels 18. An example of such an improved module is illustrated in copending application Serial No. 391,617, now Patent No. 2,816,252.

It will be seen that the first base plate carries the sockets 12 for the tubes, the inter-component connections 13, module projecting riser tabs 14, external connectors 15 and ground plane 16. (The connection paths are shown cross-hatched.) The second base plate 2 also carries inter-module element connections. It will be seen that the base plates, together with the riser panels of the modules, provide a sturdy and rigid mechanical assembly.

The circuit for separating the synchronizing pulses for the vertical and horizontal deflection voltages, herein referred to as the synch-separator, is mainly represented by the module 3 and the tube 8 in Fig. 1, and is indicated in block 3*a* in the circuit diagram in Fig. 2. The tube 8 includes in the one envelope shown in Fig. 1 the triodes represented by the two tubes 8*a* and 8*b* in Fig. 2.

An oscillator for developing the vertical deflection voltage is provided by the module 4 and tube 9 in Fig. 1 and is illustrated in the circuit diagram shown in Fig. 2 in the block 4*a*. This oscillator is coupled, as shown, to the vertical amplifier represented by the module 5 and tube 10 of the unit in Fig. 1 and in the block 5*a* in the diagram shown in Fig. 2.

An oscillator for developing the horizontal deflection voltage is represented by the module 6 and tube 11 shown in Fig. 1 and indicated in the circuit diagram in Fig. 2 in the block 6*a*. The tube 11 in Fig. 1 includes in the one envelope the triodes represented by the two tubes 11*a* and 11*b* in Fig. 2. An amplifier for the horizontal deflection voltage is represented by module 7 shown in Fig. 1 as indicated in the circuit diagram in Fig. 2 in the block 7*a*.

Resistors 19, capacitors 20 and the tubes 8*a* and 8*b* are coupled as shown constituting the circuit of the synch-separator 3*a*. Triode tube 8*a* functions as the synch-separator and triode tube 8*b* functions as an amplitude limiting device in the conventional manner. The vertical synchronizing pulses are coupled through a low-pass filter indicated in vertical oscillator block 4a. The horizontal synchronizing pulses are coupled through a high-pass filter indicated in horizontal oscillator block 6a.

The synch-separator circuit components are mounted on the wafer elements as shown in Fig. 3 and are interconnected by way of their riser elements to provide the first module 3 of the assembly of Fig. 1.

The second module 4 of the unit in Fig. 1 carries the components of the vertical oscillator circuit shown in block 4a in Fig. 2, the oscillator tube 9 being secured adjacent thereto on the first base plate 1, as shown. The coupling transformer 21 of the oscillator and the vertical hold adjustable resistor 22, provided for the circuit as shown, are attached externally to the unit.

The components of the vertical amplifier comprised in module 5 and tube 10 are illustrated in the circuit diagram in Fig. 2 as is indicated in block 5a. A vertical drive control adjustable resistor 23 is carried externally to the unit.

The module 6 and tube 11 comprise the components associated with the horizontal oscillator generally illustrated in block 6a in the circuit shown in Fig. 2. The control tube 11a and oscillator tube 11b in this circuit are included in the envelope of tube 11 of the unit in Fig. 1. A horizontal lock control adjustable capacitor 24 and a coupling circuit 25 are separately included in the system. The final module 7 includes the circuit elements associated with the horizontal amplifier and is indicated in the diagram in Fig. 2 in the block 7a. The power amplifier tube 28, horizontal drive control variable capacitor 26 and horizontal hold control variable resistor 27 being mounted in the system separately from the assembly of Fig. 1.

A connection diagram of the synch-separator module 3, including its wafers, is illustrated in Fig. 3. The resistors and capacitors of the synch-separator circuit 3a are indicated as mounted on the respective wafers in Fig. 3 and their various connections are also indicated. The inter-wafer connections are provided by the riser panel conductive paths as are diagrammatically illustrated at 34. Each riser panel carries the conductive path connections for one edge of the wafer elements, as shown.

The top sides of the wafers are illustrated in column A and the bottom sides in column B. The riser panel conductive paths indicated collectively at 29 are numbered from 1 through 12, as shown. These numbers are also applied where the respective riser panels are attached to the wafer elements in columns A and B.

Connections to the tube socket are shown in connection diagram by its representation 30. The riser panel conductive paths are broken at the desired places as indicated by the designations X. The resistors, capacitors and the connecting paths are, of course, carried on both sides of the module wafers, as shown.

Similar connection diagrams may be employed for the assembly of the other modules 4, 5, 6 and 7.

There is illustrated in Fig. 4 a matrix embodying the present invention. The purpose of this matrix is to permit the simultaneous fabrication of the module elements for the electrical components of a complete electronic assembly or circuit such as a scanning unit or even a complete radio receiver. The matrix comprises a sheet of substantially electrically non-conductive or plastic-like material. Electrically conductive material (shown cross-hatched) is formed on the sheet, contiguous therewith in configurations which define paths for interconnecting the electrical components which are to be carried by the module elements.

The configurations for the wafers, riser panels and mounting plates of the unit of Fig. 1 are depicted. The plastic-like sheet 31 may be formed, for example, of the material which is commercially available as XXXP–Phenolic. The conductive material for first printed circuit panel base plate 1 comprises the ground plate 16 and component interconnections 13 of the unit in Fig. 1.

Outlines 32 for apertures into which the module connection tabs 14 are inserted, apertures 33 into which the external connectors 15 are inserted and apertures 34 into which the tube sockets 12 are inserted, are shown.

Rows of connection configurations are provided for module wafers and riser panels as illustrated. Resistors 19 will be affixed to connections 35 and capacitors 20 will be affixed to connections 36. The connections for one side of the wafer elements of the synch-separator module 3 are illustrated in row 37 and the riser panels are shown in row 38. The connections shown in rows 39 through 46 are for the elements of the vertical oscillator module 4, vertical amplifier module 5, horizontal oscillator module 6 and horizontal amplifier module 7. The conductive material carried by second printed circuit panel base plate 2 comprises the outlines 47 of apertures into which module riser connections will be inserted, ground plane 48 and connections 49.

It will be apparent from the above that the manufacture of electronic apparatus in accordance with the present invention is both efficient and economical, and the units thus produced thereby are characterized by the highest degree of reliability and precision.

While there has been hereinbefore described what is at present considered a preferred embodiment of the invention, it will be apparent to those skilled in the art that many and various changes and modifications may be made with respect to the embodiment illustrated without departing from the spirit of the invention. It will be understood, therefore, that all those changes and modifications as fall fairly within the scope of the present invention, as defined in the appended claims, are to be considered as a part of the present invention.

What is claimed is:

1. An electrical circuit assembly, comprising: a first printed circuit panel base plate having apertures therein and conductors extending from selected ones of said apertures; a second printed circuit panel base plate, congruently disposed in parallel spaced relation with said first base plate, having apertures therein and tube sockets affixed thereto, and having conductors extending from selected ones of said apertures and said tube sockets; and a plurality of composite electronic-component modules each having a plurality of wafer elements congruently arranged in parallel spaced relation, a plurality of wedge-shaped projecting members extending from each edge of said wafer elements, said projecting members having a conductive surface, electric circuit elements mounted on said wafer elements, a plurality of supporting riser panels, one for each side of said wafer elements, said supporting riser panels having projecting riser tabs on the two longitudinally opposed edges thereof, said riser tabs having conductors thereon and being so spaced as to register with and engage the apertures in said base plates and provide selective circuit connections interconnecting said modules and said base plates, said supporting riser panels having oblong apertures therein, into which said projecting members of said wafer elements are forcibly inserted, and a plurality of conductive paths extending from said riser panel apertures electrically and selectively to interconnect said circuit elements.

2. An electrical circuit assembly, comprising: a first printed circuit panel base plate having apertures therein and conductors extending from selected ones of said apertures; a second printed circuit panel base plate, congruently disposed in parallel spaced relation with said first base plate, having apertures therein and tube sockets affixed thereto, and having conductors extending from selected ones of said apertures and said tube sockets; and a plurality of composite electronic-component plastic modules each having a plurality of plastic wafer elements congruently arranged in parallel spaced relation, a plurality of wedge-shaped projecting members extending from each edge of said wafer elements, said projecting members having a conductive surface, electric circuit elements mounted on opposite sides of said wafer elements, a plurality of plastic supporting riser panels, one for each side of said wafer elements, said supporting riser panels having projecting riser tabs on the two longitudinally opposed edges thereof, said riser tabs having conductors thereon and being so spaced as to register with and engage the apertures in said base plates and provide selective circuit connections of said modules to said base plates and hence to said other modules, said supporting riser panels having oblong apertures formed therein, into which said projecting members of said wafers are forcibly inserted, and a plurality of conductive paths extending from said riser panel apertures electrically and selectively to interconnect said circuit elements.

References Cited in the file of this patent

UNITED STATES PATENTS

| | | |
|---|---|---|
| 1,758,399 | Hodgdon | May 13, 1930 |
| 2,014,524 | Franz | Sept. 17, 1935 |
| 2,226,745 | Schrack | Dec. 31, 1940 |
| 2,474,988 | Sargrove | July 5, 1949 |
| 2,611,010 | Sass | Sept. 16, 1952 |
| 2,611,807 | Lazzery | Sept. 23, 1952 |
| 2,754,453 | Noell | July 10, 1956 |
| 2,764,713 | Alden | Sept. 25, 1956 |
| 2,774,014 | Henry | Dec. 11, 1956 |

FOREIGN PATENTS

| | | |
|---|---|---|
| 602,492 | Great Britain | May 27, 1948 |